United States Patent [19]
Iranmanesh

[11] Patent Number: 5,572,063
[45] Date of Patent: Nov. 5, 1996

[54] BIPOLAR TRANSISTOR WITH L-SHAPED EMITTER

[75] Inventor: Ali A. Iranmanesh, Sunnyvale, Calif.

[73] Assignee: National Semiconductor Corporation, Santa Clara, Calif.

[21] Appl. No.: 322,674

[22] Filed: Oct. 13, 1994

Related U.S. Application Data

[62] Division of Ser. No. 10,919, Jan. 29, 1993, Pat. No. 5,389,552.

[51] Int. Cl.$^6$ .......................... H01L 29/73; H01L 25/331
[52] U.S. Cl. .......................... 257/565; 257/578; 257/579; 257/584
[58] Field of Search .................................. 257/565, 578, 257/579, 584

[56] References Cited

U.S. PATENT DOCUMENTS

| | | | |
|---|---|---|---|
| 4,157,561 | 6/1979 | Nawata et al. | 257/565 |
| 4,647,958 | 3/1987 | Gardner | 257/198 |
| 5,021,856 | 6/1991 | Wheaton | 257/565 |
| 5,139,961 | 8/1992 | Solheim | 437/37 |
| 5,169,794 | 12/1992 | Iranmanesh | 437/31 |
| 5,219,784 | 6/1993 | solheim | 437/57 |
| 5,234,847 | 8/1993 | Iranmanesh | 437/34 |

FOREIGN PATENT DOCUMENTS

| | | |
|---|---|---|
| 0122004 | 3/1984 | European Pat. Off. . |
| 0159179 | 4/1985 | European Pat. Off. . |
| 0194832 | 3/1986 | European Pat. Off. . |
| 0450500 | 3/1991 | European Pat. Off. . |
| 0452720 | 3/1991 | European Pat. Off. . |
| 0596601 | 9/1993 | European Pat. Off. . |

OTHER PUBLICATIONS

W. Burger et al., BCTM Proceedings, BCTM 1990, pp. 78–81.

R. M. Warner, Jr., J. N. Fordemwalt, *Integrated Circuits* (McGraw–Hill, 1965), pp. 107–109.

E. S. Yang, *Fundamentals of Semiconductor Devices* (McGraw–Hill, 1978), pp. 241–243.

E. S. Yang, *Microelectronic Devices* (McGraw–Hill, 1988), pp. 134–135.

R. S. Muller, T. I. Kamins, *Device Electronics for Integrated Circuits* (Second Edition 1986), pp. 331–335.

A. Iranmanesh, M. Biswal and B. Bastani, *Total System Solution with Advanced BiCMOS*, Solid State Technology, Jul. 1992, pp. 37–40.

H. F. Cooke, *Microwave Transistors: Theory and Design*, pp. 68–86, reprinted from *Proc. IEEE*, vol. 59, Aug. 1971, pp. 1163–1181.

G. Gonzalez, *Microwave Transistor Amplifier*, (Prentice–Hall 1984), pp. 31–34.

U.S. patent application Ser. No. 07/502,943 filed Apr. 2, 1990, on behalf of V. Ilderem.

U.S. patent application Ser. No. 07/951,524 filed Sep. 25, 1992, on behalf of Ali A. Iranmanesh et al., entitled "Transistors and Methods for Fabrication Thereof".

U.S. patent application Ser. No. 07/991,075 filed Dec. 14, 1992, on behalf of Ali A. Iranmanesh et al., entitled "Transistors and Methods for Fabrication Thereof".

U.S. patent application Ser. No. 08/011,019, filed Jan. 29, 1993, on behalf of Ali A. Iranmanesh, entitled "Transistors and Methods for Fabrication Thereof".

*Primary Examiner*—Robert P. Limanek
*Assistant Examiner*—David B. Hardy
*Attorney, Agent, or Firm*—Skjerven, Morrill, MacPherson, Franklin & Friel; Norman R. Klivans

[57] ABSTRACT

A bipolar transistor is provided in which the emitters do not traverse the base but terminate inside the top surface of the base. Each emitter is L-shaped in some embodiments. The base top surface has a polygonal or circular outer boundary. The transistor has a long emitter perimeter available for base current flow and more than two emitter sides (e.g., five sides) available for base current flow. Further, the transistor has a large ratio of the emitter area to the base area. Consequently, the transistor has low noise, high gain, high frequency range, and a small size.

18 Claims, 6 Drawing Sheets

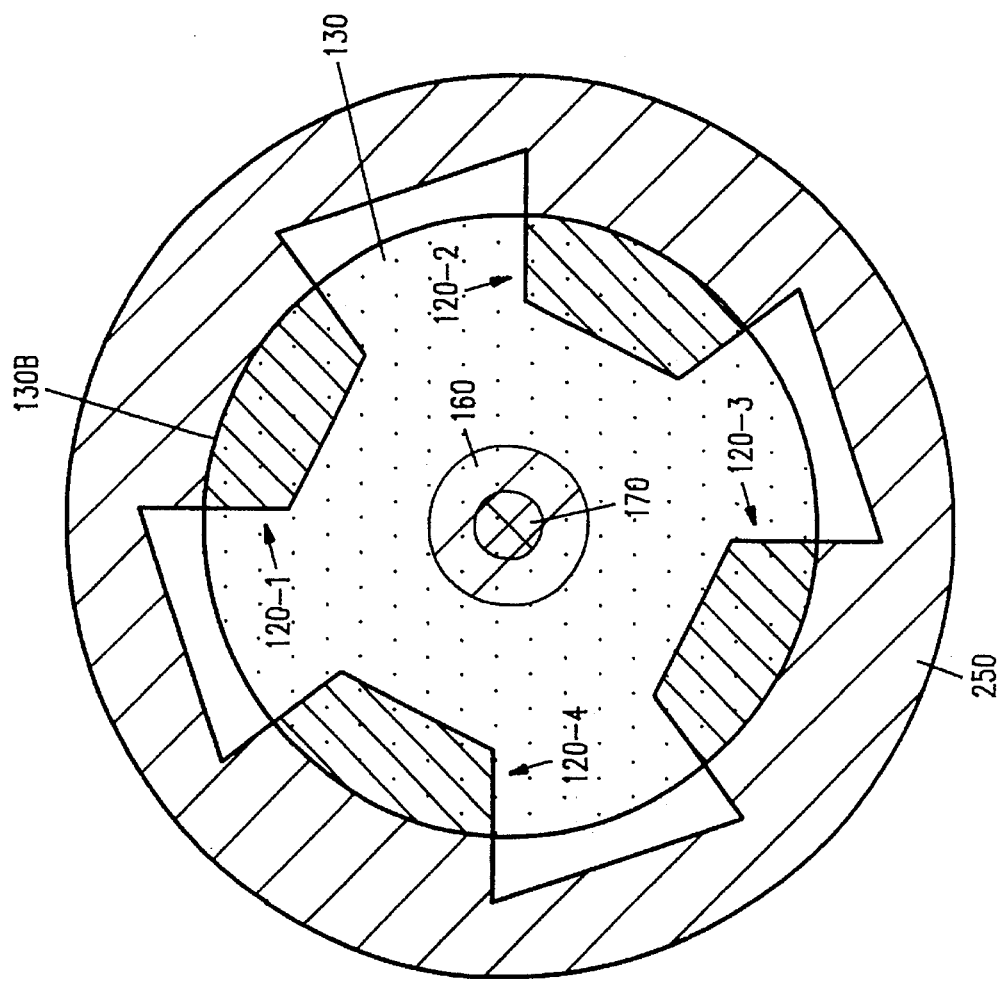

1

BIPOLAR TRANSISTOR WITH L-SHAPED EMITTER

This application is a division of U.S. patent application Ser. No. 08/010,919, filed Jan. 29, 1993, now U.S. Pat. No. 5,389,552.

BACKGROUND OF THE INVENTION

The present invention relates to electronic devices, and more particularly to bipolar transistors.

Bipolar transistors are widely used in both digital and analog circuits such as computer processors, memories, power supplies, and others. Bipolar transistors are utilized for signal amplification, switching, bias generation, and for other purposes. Because of their high speed, bipolar transistors are widely used in fast memories, fast logic arrays, and many other super fast products for data- and telecommunications.

Typical goals in a bipolar transistor design include a low transistor-generated noise, a high current and power gain (which allow low-power operation), and a high frequency range (which permits a high speed). Another goal is good matching of the electrical characteristics of similar transistors, and in particular good VBE matching measured as the difference between the base-emitter voltages at equal collector currents. VBE matching is particularly important for monolithic circuit design which relies on similar transistors having similar electrical characteristics.

These goals are advanced by reducing the transistor base, emitter and collector resistances and the base-collector capacitance and by increasing the ratio of the emitter area to the base area. The base resistance, in particular, is a major contributor to transistor-generated noise. Moreover, the base resistance decreases the frequency range of the transistor as the transistor unity-power-gain frequency $f_{max}$ is inversely proportional to the base resistance. See G. Gonzales, *Microwave Transistor Amplifiers* (Prentice-Hall, 1984) incorporated herein by reference, page 33. The emitter and collector resistances also contribute to noise and, further, they reduce the current gain and the power gain. In addition, the emitter resistance makes good VBE matching more difficult to obtain, particularly at high transistor currents. Further, the emitter and collector resistances and the base-collector capacitance decrease the transistor frequency range as they reduce both $f_{max}$ and the unity-current-gain frequency $f_t$. Reduction of the ratio of the emitter area to the base area also reduces the $f_T$ and $f_{max}$ parameters. See, for example, W. Burger et al., BCTM Proceedings, BCTM 1990, pages 78–81. Thus, reducing the base, emitter and collector resistances and the base-collector capacitance and increasing the ratio of the emitter area to the base area are important goals in transistor design.

Another goal is a small size which is needed to obtain a high packing density in the integrated circuit. In addition, reducing the base size decreases the base-collector capacitance.

FIG. 1 is a plan view of a prior art transistor 110 having three emitters 120-1, 120-2, 120-3 extending across the underlying rectangular base 130. The collector (not shown) underlies the base and electrically contacts the collector contact regions 140-1, 140-2. Low resistivity emitter contact region 150 interconnects the emitters. Low resistivity base contact region 160 overlying the base surrounds the emitters and extends between the emitters. Contact openings 164-1 through 164-6, 170-1 through 170-8, 180-1 through 180-6 in an insulating layer overlying the transistor allow the emitters, the base and the collector to be contacted by conductive layers overlying the insulating layer.

Emitters 120-i are made narrow, that is, the emitter width WE is made small, in order to reduce the intrinsic base resistance RBI, i.e., the resistance to base current of the base portions underlying the emitters. Of note, the base portions underlying the emitters (the "intrinsic base") are typically thinner in the vertical cross section and they are typically lighter-doped than the remaining ("extrinsic") base portion, and hence the intrinsic base resistance is a significant component of the total base resistance. The number of the emitters—three—is chosen to obtain a desired base-emitter junction area in accordance with the desired emitter current. Emitter contact openings 164-i are positioned away from the emitters not to restrict the emitter width—the contact openings are made wider than the emitters to obtain a low contact resistance in the openings. Base contact region portions 160-1, 160-2 extend between emitters 120-i to reduce the base resistance.

Reducing the base, emitter and collector resistances and providing a small size and a low base-collector capacitance are often conflicting goals requiring careful balancing. For example, making the emitters narrow reduces the base resistance but increases the emitter resistance. The base size becomes also increased as more emitters are needed to achieve the desired base-emitter area. Base contact region portions 160-1, 160-2 which extend between the emitters reduce the base resistance but increase the base size. Increased base size leads to a higher base-collector capacitance. The base and collector resistances can be reduced by increasing the base and collector dimensions in the direction along the emitters, but the base size, the base-collector capacitance and the emitter resistance will suffer. Thus, there is a need for a transistor which simultaneously provides low base, emitter and collector resistances, a small base size, a small overall size, and a low base-collector capacitance.

The ratio of the emitter area to the base area in transistor 110 is equal to the ratio n*WE/WB of the total emitter width to the base width, where n=3 is the number of the emitters. This ratio can be increased by increasing the total emitter width n*WE or by reducing the base width WB. Increasing the total emitter width n*WE, however, is undesirable as this would increase the base resistance. The base width WB, on the other hand, cannot be reduced below the limits set by the design rules which require a minimum spacing between emitters 120-i and base contact region 160. Thus there is a need for a transistor having a larger ratio of the emitter area to the base area for the same emitter width and the same design rules.

SUMMARY OF THE INVENTION

The present invention provides a transistor with low base, emitter and collector resistances, a small base size, a small overall size, a low base-collector capacitance and a large ratio of the emitter area to the base area. These and other advantages are achieved in some embodiments by making the emitters extend along the boundary of the base top surface and by shaping the emitters so as to increase their perimeter and the number of sides available for base current flow. For example, in some embodiments, the base top surface is a circle or a regular polygon having five or more sides. Each emitter is substantially L-shaped with one portion extending from the base top surface boundary radially to the center of the base top surface and another portion extending along the boundary of the base top surface and close to the boundary. Such an emitter has five sides overlying the interior of the base, and a long perimeter. The large number of sides and the long perimeter reduce the base and collector resistances. Each emitter can be made relatively short to reduce the emitter resistance. At the same time, the combined emitter length of all the emitters is large because the emitters are located along the boundary of the base top surface and the boundary is long. The large combined emitter length results in a large emitter area and therefore in a large ratio of the emitter area to the base area.

In some embodiments, the extrinsic base has on top a low resistivity material, e.g., titanium silicide. Because the base-emitter junctions do not extend across the base, the low-resistivity material interconnects the base surface between the emitters and thus makes it unnecessary for the base contact region to extend between the emitters. The base size can therefore be reduced, with the consequent increase in the packing density and reduction in the base-collector capacitance.

Other features and advantages of the invention are described below. The invention is defined by the appended claims.

BRIEF DESCRIPTION OF THE DRAWINGS

FIG. 7 is a plan view of a portion of a transistor according to the present invention.

DESCRIPTION OF THE PREFERRED EMBODIMENTS

Figure 2:
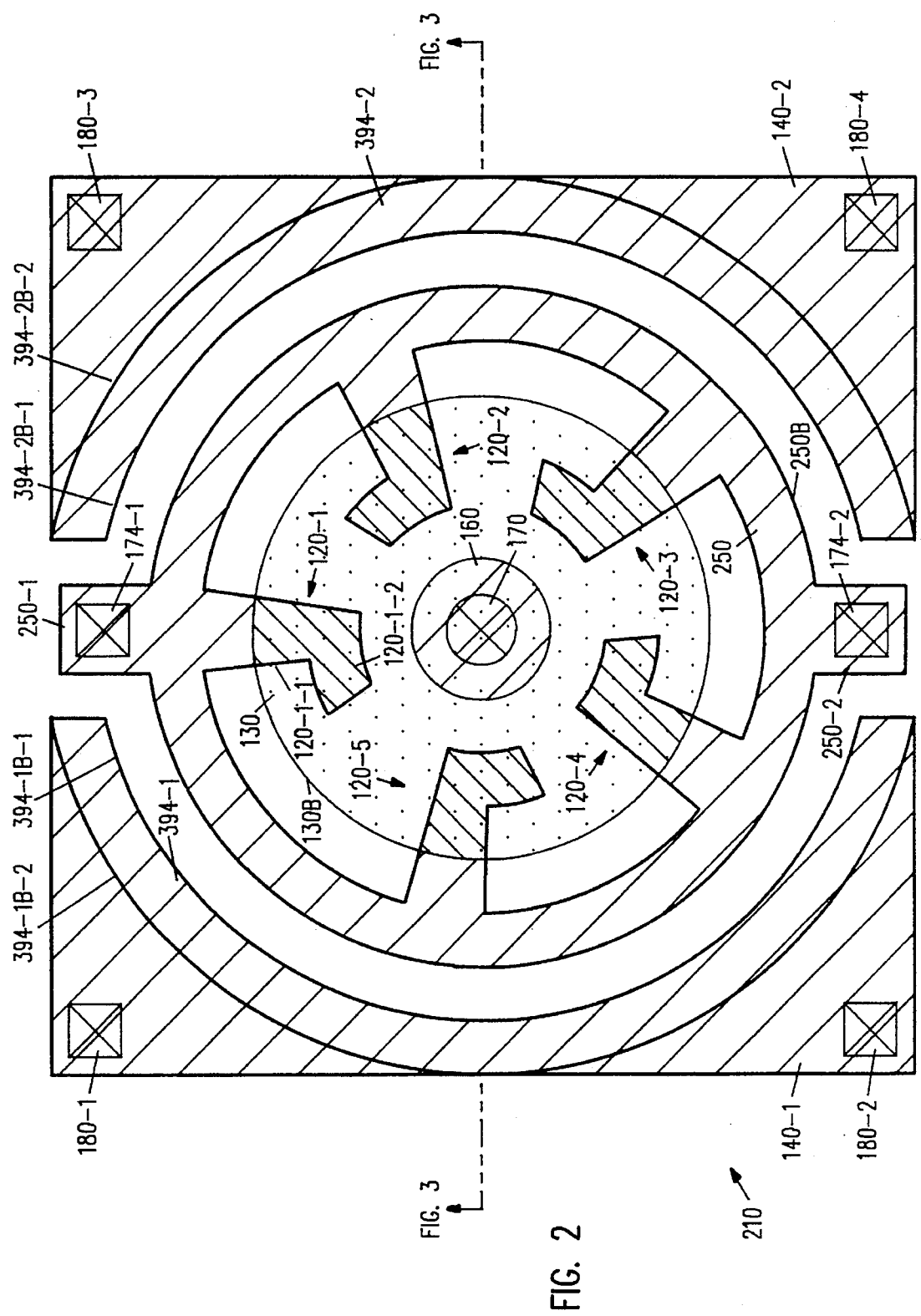
FIG. 2 is a plan view of a transistor according to the present invention.
Figure 3:
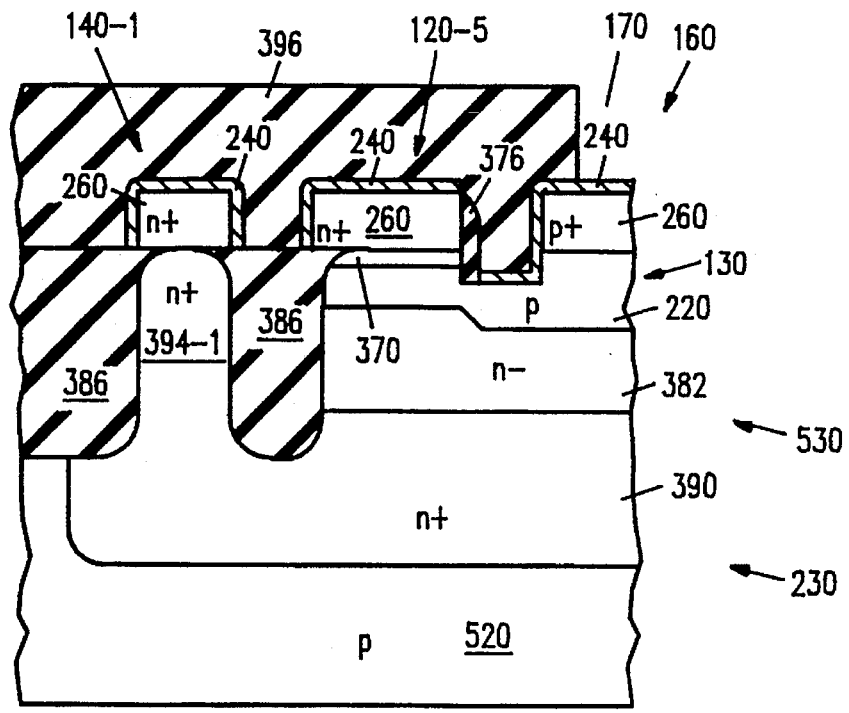
FIG. 3 shows a vertical cross section of the transistor of FIG. 2.

FIG. 2 is a plan view of a transistor 210 according to the present invention. FIG. 3 shows a cross section of the left half of transistor 210. While transistor 210 is an npn transistor, similar pnp transistors are obtained by reversing the conductivity types in transistor 210.

As shown in FIG. 2, each emitter 120-1 through 120-5 extends laterally from the outer boundary 130B of the top surface of base 130 inside the top surface and terminates inside the top surface. The base top surface is a circle in plan view. Base 130 includes a substantially cylindrical p-doped region 220 (FIG. 3) of monocrystalline silicon substrate 230, and base 130 also includes that portion of refractory metal silicide 240 (e.g., titanium silicide) which overlies and contacts the region 220. In some embodiments, boundary 130B is in plan view a polygon rather than a circle. In some embodiments, the polygon has five or more sides. In some embodiments, the polygon is regular. In other embodiments, boundary 130B is an ellipse. Still other shapes are used in other embodiments.

Emitter 120-1 is substantially L-shaped. Portion 120-1-1 of emitter 120-1 extends laterally from the boundary of the base top surface inside the base top surface. Portion 120-1-2 of emitter 120-1 extends laterally at an angle to portion 120-1-1. In some embodiments, the two portions do not intersect as they do in FIG. 2. For example, in some embodiments, the two portions lie at an angle to each other and are joined by a third portion which, for example, extends along a smooth curve and joins the portions 120-1-1 and 120-1-2.

Each emitter 120-2 through 120-5 is similar in shape to emitter 120-1.

Each emitter 120-i includes that portion of contiguous conductive layer 250 which overlies base 130. Layer 250 consists of an n+ portion of polysilicon layer 260 (FIG. 3) and of metal silicide 240 overlying the n+ polysilicon portion. Each emitter 120-i also includes n+ region 370 of substrate 230 which region underlies the polysilicon portion of layer 250 and overlies the base. Silicon dioxide spacers 376 on polysilicon sidewalls of emitters 120 isolate the emitters from the metal silicide portion of base 130.

Outer boundary 250B of contiguous conductive layer 250 is circular in plan view except at the location of emitter contact openings 174-1, 174-2 where the layer 250 forms projections 250-1, 250-2 to accommodate the contact openings. Except for the projections, layer 250 is narrow, of 0.8 μm width in one embodiment, allowing collector contact regions 140-1, 140-2 to be brought close to emitters 120. A small transistor size is obtained as a result. The collector resistance also becomes small because of the short collector current path between the emitters and the collector contact regions.

In some embodiments, outer boundary 250B is an ellipse or a polygon except at the locations of the emitter contact openings. Other shapes are used in other embodiments.

Emitter contact openings 174-1, 174-2 terminate at layer 250 but not at the emitters 120 to allow the emitters to be narrower than the contact openings. In one embodiment, each emitter 120-i is about 0.8 μm wide, and each contact opening 174-i is in plan view a square 1.0×1.0 μm.

Base 130 and n– collector 382 (FIG. 3) underlying the base are surrounded by field oxide 386 which isolates the base and the collector from the rest of the integrated circuit. N+ buried layer 390 underlies collector 382 and the surrounding field oxide 386 and provides a low resistance path from the collector to n+ sinker regions 394-1, 394-2. The buried layer and the sinker regions have a lower resistivity than the collector. Sinker regions 394-i, i=1,2 extend to the top surface of substrate 230 to allow collector 382 to be electrically contacted from the top surface. Sinker regions 394-i substantially surround the emitter, the base and the collector except that the sinker regions are interrupted to make room for projections 250-1, 250-2. Field oxide 386 surrounds the sinker regions and extends through the transistor outside the base/collector region and the sinker regions.

In plan view, inner boundary 394-1B-1 (FIG. 2) and outer boundary 394-1B-2 of the top surface of sinker region 394-1 are circular, or elliptical, or polygon-shaped, or of some other shape. Inner boundary 394-2B-1 and outer boundary 394-2B-2 of the top surface of sinker region 394-2 are also circular, or elliptical, or polygon-shaped, or of some other shape.

Collector contact regions 140-1, 140-2 are formed over the respective sinker regions 394-1, 394-2 from n+ portions of polysilicon layer 260 and from the overlying metal silicide 240. Base contact region 160 in the middle of the base is formed from a p+ portion of polysilicon layer 260 and from the overlying metal silicide 240. Insulator 396, which is silicon dioxide in one embodiment, overlies the base, the emitters and the collector. Base contact opening 170, collector contact openings 180-1 through 180-4, and emitter contact openings 174-1, 174-2 are formed in insulator 396 to allow contact to base contact region 160, to collector contact regions 140-1, 140-2, and to contiguous conductive layer 250.

Figure 4:
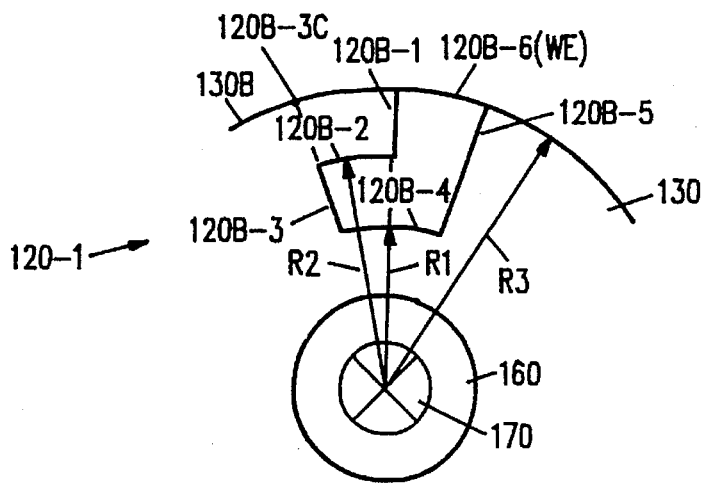
FIG. 4 is a plan view of a portion of the transistor of FIG. 2.

Transistor 210 has a low base resistance because transistor 210 has, for given emitter area and emitter width, a long five-sided emitter perimeter available for base current flow. For example, as illustrated in FIG. 4, emitter 120-1 has five sides 120B-1 through 120B-5 through which and under which the base current flows into the emitter, as compared to only two sides in the prior art transistor 110 of FIG. 1. The base current paths in transistor 210 extend from under the five sides 120B-1 through 120B-5 laterally away from the base-emitter junction.

The increase in the emitter perimeter in transistor 210 per given emitter area and emitter width can be seen from the following example. Suppose that the base 130 is in plan view a circle of radius R3=3.4 μm. The side 120B-4 of emitter 120-1 is an arc of a circle of radius R1=1.9 μm. Side 120B-3 is a radial segment of length 0.9 μm. Side 120B-2 is an arc of a circle of radius R2=R1+0.9=2.8 μm. Side 120B-6 which extends along the base top surface boundary 130B is 0.8 μm. Side 120B-1 is a radial segment of length R3−R2= 0.6 μm. Side 120B-5 is a radial segment of length R3−R1= 1.5 μm. Suppose also that if the side 120B-3 were continued along the radius it would intersect the boundary 130B at a point 120B-3C which is 0.8 μm away from side 120B-6.

Under these assumptions, the length of side 120B-2 is $0.8/R3*R2=0.66$ μm. (In this and the following computations, all the numbers are rounded to the second place after the decimal point.) The length of side 120B-4 is $0.8*2/R3*R1=0.89$ μm.

These dimensions provide the emitter width of about 0.8 μm. More particularly, the width of portion 120-1-1 (FIG. 2) of the emitter is less than the length of side 120B-6 and thus is less than 0.8 μm. The width of portion 120-1-2 is equal to the length of side 120B-3 which is 0.9 μm. The small emitter width is chosen to obtain a low base resistance.

The emitter perimeter available for base current flow, that is, the total length of sides 120B-1 through 120B-5, is 0.6+0.66+0.9+0.89+1.5=4.55 μm.

The area of emitter 120-1 is equal to:

$$\pi(R3^2-R2^2)*0.8/(2\pi*R3)+\pi(R2^2-R1^2)*1.6/(2\pi*R3)=1.43 \text{ μm}^2$$

Thus transistor 210 in this example has a 4.55 μm emitter perimeter available for base current flow per 1.43 μm² emitter area. (While transistor 210 may have other emitters, they are not included in this computation because if they were included, the emitter perimeter per emitter area ratio would remain the same provided that the other emitters have the same shape and dimensions as emitter 120-1.)

Turning for comparison to the prior art transistor 110 (FIG. 1) and assuming that transistor 110 has the same emitter area of 1.43 μm² and about the same emitter width WE=0.8 μm, transistor 110 has only 1.43/0.8*2=3.58 μm emitter perimeter available for base current flow. This figure is about 27% lower than the 4.55 μm figure for transistor 210. Moreover, in transistor 210 each emitter has five sides available for base current flow versus only two sides in the prior art transistor 110.

The large emitter perimeter available for base current flow and the large number of the emitter sides available for base current flow cause a significant reduction in the base and collector resistances as explained in the U.S. patent application Ser. No. 07/951,524 filed Sep. 25, 1992 by A. A. Iranmanesh et al. now abandoned and hereby incorporated herein by reference now abandoned.

The low base resistance leads to a low transistor-generated noise and a high frequency range as explained above. Further, the low base resistance capability allows one to meet the noise and frequency range requirements for a given application at a reduced base area, which in turn allows a higher packing density and a lower base-collector capacitance. The low collector resistance permits achieving a high transistor frequency range, a high current gain, a high power gain and a low transistor-generated noise, as explained above.

The emitter resistance is low in some embodiments because each emitter 120-i in these embodiments is short and hence each emitter is close to the emitter contact openings 174-1, 174-2 (FIG. 2). Moreover, transistor 210 has five emitters connected in parallel, and so the total resistance of the silicide portion of the emitters is only ⅕ of the resistance of the silicide portion of a single emitter.

In some embodiments, the emitter resistance is reduced even further by additional emitter contact openings provided along the layer 250. In some such embodiments, layer 250 is provided with additional projections to accommodate the additional contact openings, and the sinker regions 394-i are interrupted to make room for the projections. Similar emitter contact openings are described in the U.S. patent application Ser. No. 08/011,019 "TRANSISTORS AND METHODS FOR FABRICATION THEREOF" filed by A. A. Iranmanesh on Jan. 29, 1993 which application is hereby incorporated herein by reference now abandoned.

A low emitter resistance permits achieving a high current drive, a high power gain, good VBE matching, and a low transistor-generated noise, as explained above.

Figure 1:
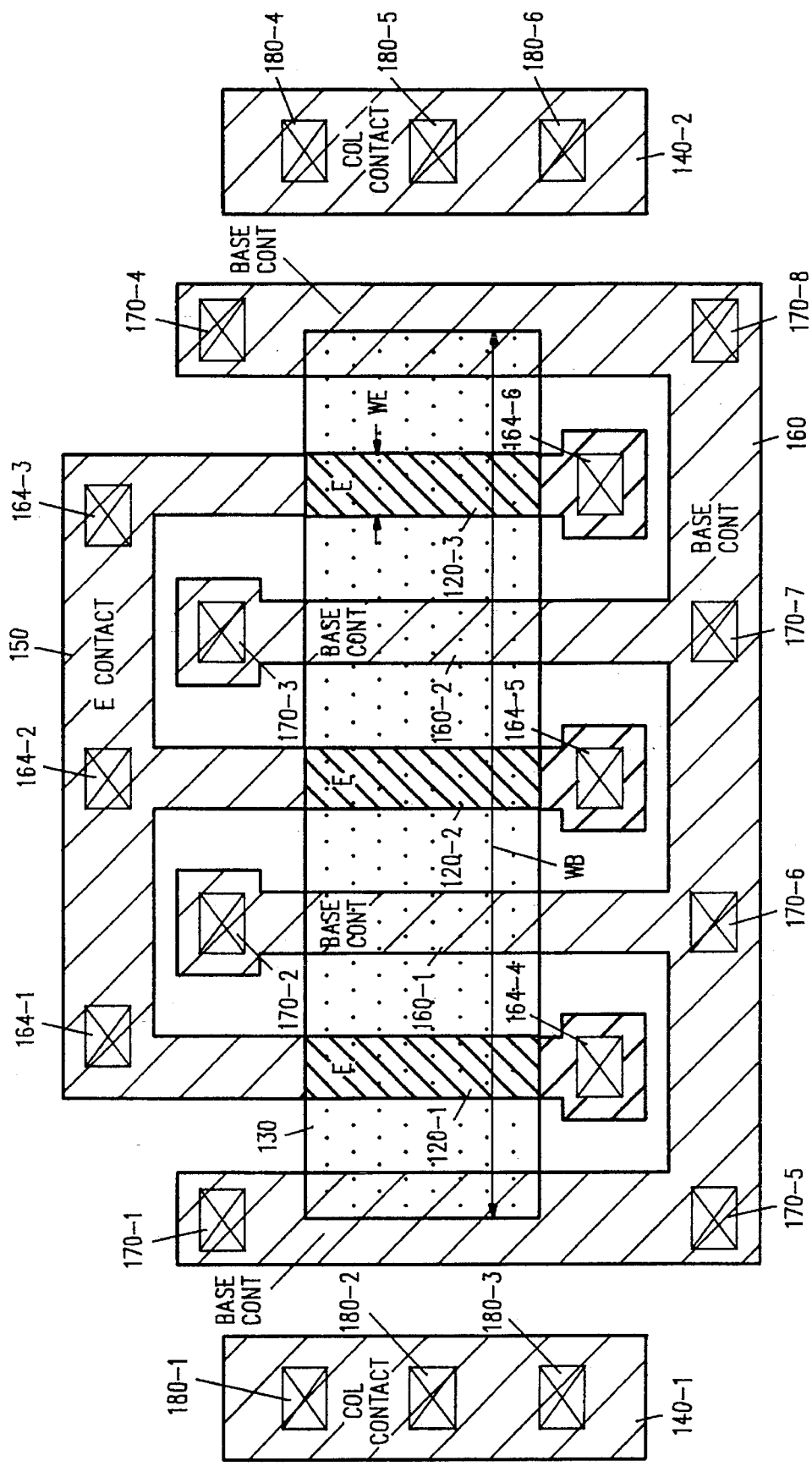
FIG. 1 is a plan view of a prior art transistor.

The base size and the overall size of transistor 210 are reduced in some embodiments because of the elimination of base contact region portions between the emitters—cf. base contact region portions 160-1, 160-2 in the prior art FIG. 1. Base contact region 160 in transistor 210 needs not extend between the emitters because the base regions between the emitters are connected to base contact region 160 by low-resistivity metal silicide 240. (In one embodiment, metal silicide 240 is titanium silicide having resistivity of 2Ω per square.) A small base size permits achieving a low base-collector capacitance, a high frequency range, and a high packing density, as explained above.

Transistor 210 has a large ratio of the emitter area to the base area because the emitters 120 extend along the boundary of the base top surface. In particular, emitter portion 120-1-2 extends along the boundary 130B close to the boundary. Placing the emitters along the boundary rather than across the boundary as in FIG. 1 allows increasing the emitter length, and hence the emitter area, without increasing the emitter width.

The improvement in the ratio of the emitter area AE to the base area AB is illustrated by the example of FIG. 4. Suppose that the base top surface boundary 130B is a circle, the emitter sides 120B-2 and 120B-4 are circular arcs, and the sides 120B-1, 120B-3 and 120B-5 are radial segments. Suppose also that the base contact opening 170 is a circle, base contact region 160 is also a circle, and that the following dimensions are the minimal dimensions allowed by the design rules: base contact opening 170 is 1.0 μm in diameter; base contact region 160 has the radius 0.4 μm greater than the radius of base contact opening 170; the radial distance between base contact region 160 and emitters 120 is 1.0 μm; the length of side 120B-6 is 0.8 μm; the length of side 120B-3 is 0.9 μm; and the point 1.20B-3C is 0.8 μm away from side 120B-6. These minimal dimensions provide the dimensions of the perimeter computation example above. In particular, R1=1.9 μm, R2=2.8 μm, and R3=3.4 μm. The area of emitter 120-1 is 1.43 μm² as shown above in the perimeter computation example.

Suppose that the design rules require a minimum 0.8 μm spacing between the emitters along the boundary 130B so that, in particular, the point 120B-3C must be spaced from the next counter-clockwise emitter (which is not shown) by at least 0.8 μm measured along the boundary. Thus, each emitter 120-i occupies 0.8*3=2.4 μm along the boundary 130B. The length of boundary 130B is 2π*R3=21.36 μm. Hence, transistor 210 can have up to 8 emitters of the same shape and dimensions as emitter 120-1. The entire emitter area AE in that case is 1.43*8=11.44 μm².

The base area AB=π*R3²=36.32 μm². The ratio of AE/AB=0.31.

By contrast, using the same emitter width, the same design rules and the minimal dimensions, the ratio AE/AB of prior art transistor 110 of FIG. 1 is only 0.22. Namely, suppose that in FIG. 1 the emitter width WE=0.8 μm; the width of each base contact region portion 160-1, 160-2 is also 0.8 μm; the distance between the adjacent base contact region portion 160-i and emitter 120-j is 1.0 μm; and the base portions on the left of emitter 120-1 and on the right of emitter 120-3 are each 1.5 μm wide to allow base contact region 160 to contact the base on both sides of the emitters. The total base width WB is then 3*0.8+2*0.8+4*1.0+2*1.5= 11.0 μm. The ratio AE/AB=3*WE/WB=0.22, which is about 1.4 times smaller than the 0.31 ratio for transistor 210. The 140% increase in the AE/AB ratio leads to a significant increase in the $f_T$ and $f_{max}$ parameters and hence to a significant improvement in the transistor frequency range.

Because sinker regions 394-1, 394-2 substantially surround the emitters, transistor 210 has a low collector resistance as explained in the aforementioned U.S. patent application Ser. No. 08/011,019 entitled "TRANSISTORS AND METHODS FOR FABRICATION THEREOF" filed by A. A. Iranmanesh on Jan. 29, 1993.

Figure 5:
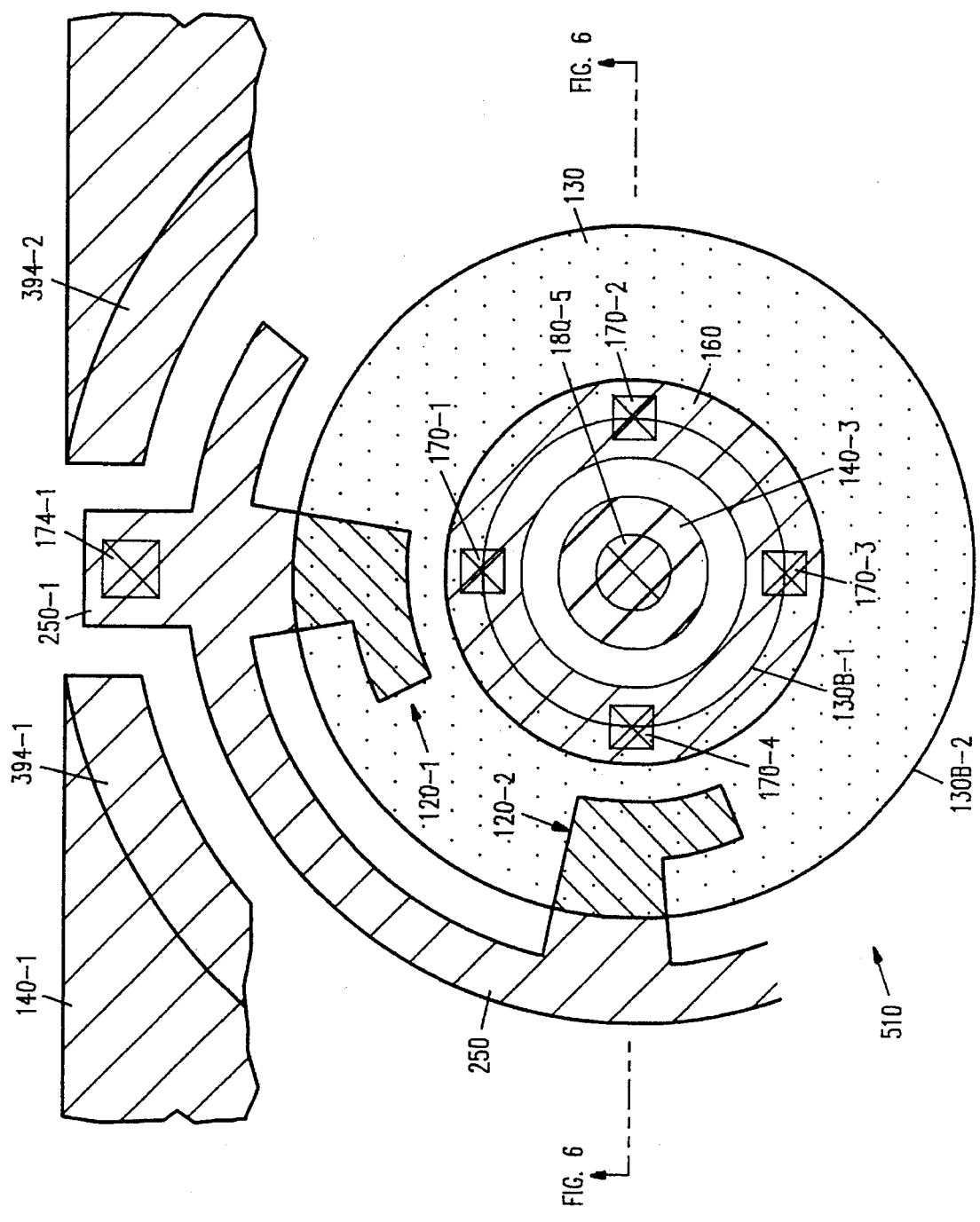
FIG. 5 is a plan view of a transistor according to the present invention.
Figure 6:
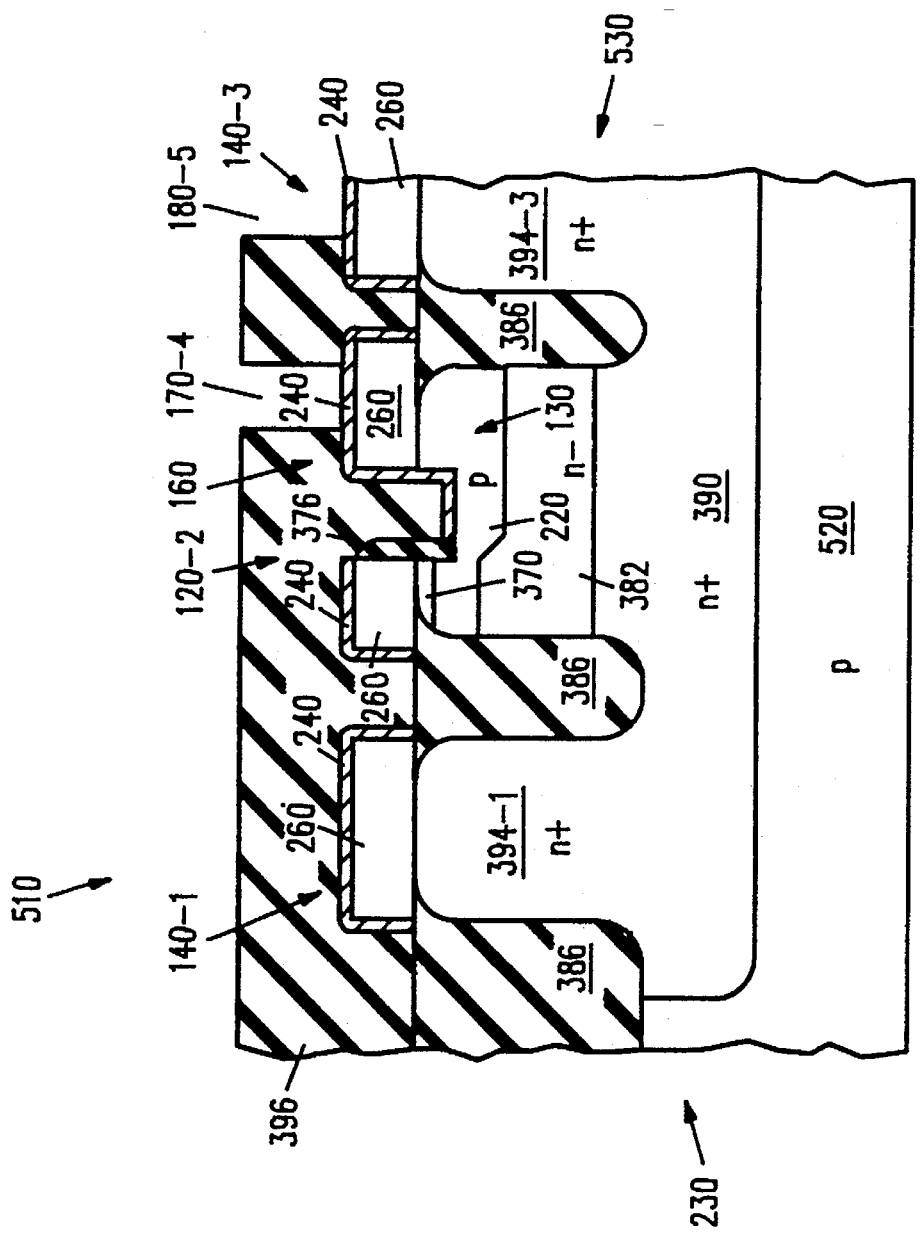
FIG. 6 shows a vertical cross section of the transistor of FIG. 5.

FIGS. 5 and 6 illustrate respectively a plan view and a cross-section of a high performance transistor 510. FIG. 6 shows only the left half of the cross-section. Transistor 510 is similar to transistor 210 of FIGS. 2–4 but transistor 510 has an additional collector contact region 140-3 in the middle of ring-shaped base 130. Additional sinker region 394-3 (FIG. 6) connects buried layer 390 to the substrate surface at the location of collector contact region 140-3. Additional collector contact opening 180-5 terminates at the collector contact region. The additional collector contact region and the additional sinker region further reduce the collector resistance.

The base top surface of transistor 510 has an inner boundary 130B-1 and an outer boundary 130B-2. Each boundary 130B-i is a circle, or an ellipse, or a polygon, or of some other shape, similar to boundary 130B of transistor 210. In particular, in some embodiments, boundary 130B-1 or 130B-2 or both are a regular polygon having five or more sides.

Base contact openings are shown at 170-1 through 170-4.

FIG. 7 is a plan view of a portion of transistor 710 in which each emitter 120-1 through 120-4 has three sides —two sides extending radially from the base top surface boundary 130B and one side interconnecting the two sides. The sinker regions and the collector contact regions are not shown but are similar to those of transistor 210. The emitter contact openings (not shown) terminate on contiguous conductive layer 250. In some embodiments, layer 250 has projections on which the emitter contact openings terminate, as in transistor 210.

In some embodiments, transistor 710 has a ring-shaped base and additional sinker and collector contact regions in the middle of the base similarly to transistor 510.

Transistors 210, 510 and 710 of FIGS. 2–7 are fabricated in some embodiments using one of the processes described in the following documents incorporated herein by reference: U.S. patent application Ser. No. 07/951,524 entitled "TRANSISTORS AND METHODS FOR FABRICATION THEREOF" filed Sep. 25, 1992 by A. Iranmanesh et al. now abandoned; U.S. patent application Ser. No. U.S. Pat. No. 5,338,696 entitled "METHOD OF FABRICATING BiCMOS DEVICE", issued Aug. 16, 1994, which is a division of U.S. patent application Ser. No. 07/847,876, which is a continuation of 07/502,943 entitled "BICMOS DEVICE AND METHOD OF FABRICATION" filed Apr. 2, 1990 by V. Ilderem et al. now abandoned; U.S. patent application Ser. No. 07/503,498 entitled "HIGH PERFORMANCE SEMICONDUCTOR DEVICES AND THEIR MANUFACTURE" filed Apr. 2, 1990 by A. G. Solheim et al. now U.S. Pat. No. 5,139,961 issued Aug. 18, 1992; and the article by A. Iranmanesh et al., *Total System Solution with Advanced BiCMOS,* Solid State Technology, July 1992, pages 37–40. In one embodiment, for example, transistors 210, 510 and 710 are fabricated as follows.

P substrate 520 which forms the bottom part of substrate 230 is masked to define buried layer 390. An n dopant is implanted to form the buried layer.

N– epitaxial layer 530 is grown on substrate 520 to provide the top part of substrate 230. Field oxide regions 386 are formed in epitaxial layer 530. The n+ buried layer extends partially into the epitaxial layer due to dopant outdiffusion.

An n dopant is implanted into the sinker regions 394. Then polysilicon layer 260 is deposited and doped by a p dopant. The p dopant outdiffuses into the epitaxial layer 530 and converts region 220 of the epitaxial layer to the p conductivity type. Additional p and n dopants are selectively introduced into the polysilicon layer so that the polysilicon becomes doped n+ at the location of contiguous conductive layer 250 and collector contact regions 140, and the polysilicon becomes doped p+ at the location of bade contact region 160. Polysilicon layer 260 is then masked and etched to define contiguous conductive layer 250, base contact region 160, and collector contact regions 140.

The dopants from polysilicon layer 260 outdiffuse into epitaxial layer 530 to form n+ emitter region 370 and to increase the p dopant concentration in the base region 220 near base contact region 160. The overetch of polysilicon layer 260 is controlled to be greater than the depth of emitter region 370 in order to reduce the emitter-base capacitance. In one embodiment, the depth of region 370 is about 500Å while the polysilicon is overetched by about 1200Å from the surface of epitaxial layer 530.

Additional p dopant is introduced into the extrinsic base (that is, the base portion not covered by the emitter). Silicon dioxide spacers 376 are formed around the emitter. Metal silicide 240, silicon dioxide 396, contact openings 180, 170 and 174, and overlying metal layers (not shown) are then formed as described, for example, in the aforementioned U.S. patent application Ser. No. 07/503,498 now U.S. Pat. No. 5,139,961 issued Aug. 18, 1992. (Solhelm et al.).

While the invention has been illustrated with respect to the embodiments described above, other embodiments and variations not described herein are within the scope of the invention. The invention is not limited by the number or particular shape of the emitters. In some embodiments, for example, one or more emitters are T-shaped. For example, in some embodiments portion 120-1-2 in FIG. 2 extends both clockwise and counter clockwise from portion 120-1-1. In some embodiments portion 120-1-1 extends towards the base center beyond portion 120-1-2. Further, in some embodiments, a collector contact region and a sinker region completely surround the base and the collector. The invention covers pnp transistors obtained by reversing the conductivity types in the npn transistors. Pnip and npin transistors are also covered. The invention is not limited by particular materials. The invention covers non-silicon devices including, for example, germanium and gallium arsenide devices. The invention is not limited by the crystal structure of the materials. Other embodiments and variations are within the scope of the invention as defined by the following claims.

What is claimed is:

1. A transistor comprising:

a collector;

a base overlying said collector, said base having a top surface; and a first emitter overlying said top surface of said base and comprising:

a first portion which in plan view extends from a boundary of said top surface of said base inside said top surface; and a second portion which in plan view extends at an angle to said first portion, and wherein said first emitter is in plan view substantially L-shaped.

2. The transistor of claim 1 further comprising a second emitter overlying said top surface of said base and spaced from said first emitter, said second emitter comprising:

a first portion which in plan view extends from said boundary of said top surface of said base inside said top surface; and a second portion which in plan view extends at an angle to said first portion.

3. The transistor of claim 2 wherein said second emitter is L-shaped.

4. The transistor of claim 1 wherein said top surface of said base is in plan view substantially a polygon with at least five sides.

5. The transistor of claim 1 wherein said top surface of said base is in plan view substantially circular.

6. The transistor of claim 1 wherein said second portion of said first emitter does not overlie the boundary of said top surface of said base.

7. The transistor of claim 1 wherein:

said collector is formed in a semiconductor substrate having a top surface; and said substrate comprises a conductive region connecting said collector to said top surface of said substrate such that at least a portion of said region substantially laterally surrounds said collector.

8. The transistor of claim 1 wherein:

said collector is formed in a semiconductor substrate having a top surface; and said substrate comprises a conductive region connecting said collector to said top surface of said substrate such that at least a portion of said region is laterally surrounded by said collector.

9. A transistor comprising:

a collector;

a base overlying said collector, said base having a top surface having an outer boundary which in plan view is substantially a polygon having at least five sides; and a first emitter overlying said top surface of said base so as to overlie a portion of said outer boundary of said top surface but not the entire outer boundary of said top surface, and wherein said first emitter is in plan view substantially L-shaped.

10. The transistor of claim 9 further comprising a second emitter spaced from said first emitter, said second emitter overlying said top surface of said base so as to overlie a portion of said outer boundary of said top surface.

11. The transistor of claim 10 wherein said second emitter is in plan view substantially L-shaped.

12. The transistor of claim 9 wherein:

said collector is formed in a semiconductor substrate having a top surface; and said substrate comprises a conductive region connecting said collector to said top surface of said substrate such that at least a portion of said region substantially laterally surrounds said collector.

13. The transistor of claim 9 wherein:

said collector is formed in a semiconductor substrate having a top surface; and said substrate comprises a conductive region connecting said collector to said top surface of said substrate such that at least a portion of said region is laterally surrounded by said collector.

14. A transistor comprising:

a collector;

a base overlying said collector, said base having a top surface having an outer boundary which in plan view is substantially circular; and a first emitter overlying said top surface of said base so as to overlie a portion of said outer boundary of said top surface but not the entire outer boundary of said top surface, and wherein said first emitter is in plan view substantially L-shaped.

15. The transistor of claim 14 further comprising a second emitter spaced from said first emitter, said second emitter overlying said top surface of said base so as to overlie a portion of said outer boundary of said top surface.

16. The transistor of claim 15 wherein said second emitter is in plan view substantially L-shaped.

17. The transistor of claim 14 wherein:

said collector is formed in a semiconductor substrate having a top surface; and said substrate comprises a conductive region connecting said collector to said top surface of said substrate such that at least a portion of said region substantially laterally surrounds said collector.

18. The transistor of claim 14 wherein:

said collector is formed in a semiconductor substrate having a top surface; and said substrate comprises a conductive region connecting said collector to said top surface of said substrate such that at least a portion of said region is laterally surrounded by said collector.

* * * * *